US012477690B2

United States Patent
Yeh et al.

(10) Patent No.: US 12,477,690 B2
(45) Date of Patent: Nov. 18, 2025

(54) METHOD FOR MANUFACTURING VAPOR CHAMBER

(71) Applicant: Jentech Precision Industrial Co., LTD., Taoyuan (TW)

(72) Inventors: Chun-Ta Yeh, Taoyuan (TW); Chin-Long Lin, Taoyuan (TW)

(73) Assignee: Jentech Precision Industrial Co., LTD., Taoyuan (TW)

( * ) Notice: Subject to any disclaimer, the term of this patent is extended or adjusted under 35 U.S.C. 154(b) by 0 days.

(21) Appl. No.: 18/959,686

(22) Filed: Nov. 26, 2024

(65) Prior Publication Data

US 2025/0089210 A1 Mar. 13, 2025

Related U.S. Application Data

(62) Division of application No. 18/513,656, filed on Nov. 20, 2023, now Pat. No. 12,213,284, which is a (Continued)

(30) Foreign Application Priority Data

Mar. 25, 2021 (TW) .................................. 110110908

(51) Int. Cl.
*H05K 7/20* (2006.01)
*B21D 53/02* (2006.01)
*B23P 15/26* (2006.01)

(52) U.S. Cl.
CPC ......... *H05K 7/20309* (2013.01); *B21D 53/02* (2013.01); *B23P 15/26* (2013.01); *H05K 7/20327* (2013.01); *H05K 7/20318* (2013.01)

(58) Field of Classification Search
CPC ................................. B23P 15/26; B21D 53/02
See application file for complete search history.

(56) References Cited

U.S. PATENT DOCUMENTS 10,739,081 B2 * 8/2020 Zhou .................. F28D 15/0233
11,054,189 B2 * 7/2021 Salim Shirazy ...... F28F 21/062
(Continued)

FOREIGN PATENT DOCUMENTS

CN 201653234 U 11/2010
CN 201805672 U 4/2011
(Continued)

OTHER PUBLICATIONS

English Machine Translation of JP-2015010765-A (Year: 2015).*

*Primary Examiner* — Sarang Afzali
(74) *Attorney, Agent, or Firm* — CKC & Partners Co., LLC

(57) ABSTRACT

A method for manufacturing a vapor chamber includes forming a base plate by forging. The base plate includes a plate body, a peripheral frame and some pillars separated from each other and surrounded by the peripheral frame. The surface and the peripheral frame define a space. The method includes abutting a top plate against the peripheral frame and the pillars to seal up the space to form a main body; disposing an infusion tube between the base plate and the top plate, and vacuuming the space through the infusion tube; introducing a fluid into the space through the infusion tube; sealing up the infusion tube; and forming, by injection molding, an outer frame including two frame bodies and an encapsulating structure connected with one of the frame bodies, a portion of the infusion tube exposed outside the main body is embedded inside the encapsulating structure.

12 Claims, 6 Drawing Sheets

Related U.S. Application Data division of application No. 17/585,597, filed on Jan. 27, 2022, now Pat. No. 11,985,796.

(56) References Cited

U.S. PATENT DOCUMENTS

| | | |
|---|---|---|
| 11,448,474 B2 | 9/2022 | Liu et al. |
| 11,516,940 B2 | 11/2022 | Weng |
| 2009/0040726 A1 | 2/2009 | Hoffman et al. |
| 2016/0128233 A1 | 5/2016 | Lai |
| 2018/0066897 A1 | 3/2018 | Lin |
| 2019/0186839 A1 | 6/2019 | Liu et al. |
| 2019/0249928 A1 | 8/2019 | Zhou et al. |
| 2020/0111728 A1 | 4/2020 | Chen et al. |

FOREIGN PATENT DOCUMENTS

| | | |
|---|---|---|
| CN | 106996710 A | 8/2017 |
| CN | 207816071 U | 9/2018 |
| CN | 210900132 U | 6/2020 |
| JP | 2015010765 A | 1/2015 |
| TW | 201725354 A | 7/2017 |
| TW | I618907 B | 3/2018 |
| TW | M614442 U | 7/2021 |

\* cited by examiner

500

```
┌─────────────────────────────────────────────────────────┐
│ Forming an integrally-formed base plate by forging. The │
│ base plate includes a plate body, a peripheral frame    │
│ and a plurality of supporting pillars. The peripheral   │
│ frame and the supporting pillars protrude at a surface  │
│ of the plate body. The supporting pillars are separated │
│ from each other and distributed on the surface of the   │
│ plate body. The peripheral frame surrounds the          │
│ supporting pillars. The surface and the peripheral      │
│ frame together define a first space configured to       │
│ accommodate a working fluid.                            │
└─────────────────────────────────────────────────────────┘ — 501
                              ↓
┌─────────────────────────────────────────────────────────┐
│ Abutting a top plate against the peripheral frame and   │
│ the supporting pillars to seal up the first space to    │
│ form a main body.                                       │
└─────────────────────────────────────────────────────────┘ — 502
                              ↓
┌─────────────────────────────────────────────────────────┐
│ Vacuuming the first space through a liquid infusion     │
│ tube.                                                   │
└─────────────────────────────────────────────────────────┘ — 503
                              ↓
┌─────────────────────────────────────────────────────────┐
│ Introducing the working fluid into the first space      │
│ through the liquid infusion tube.                       │
└─────────────────────────────────────────────────────────┘ — 504
                              ↓
┌─────────────────────────────────────────────────────────┐
│ Sealing up the liquid infusion tube after an            │
│ appropriate amount of the working fluid is introduced   │
│ into the first space.                                   │
└─────────────────────────────────────────────────────────┘ — 505
                              ↓
┌─────────────────────────────────────────────────────────┐
│ Fixing the main body in a mold and forming a plastic    │
│ outer frame by injection molding in the mold. The       │
│ plastic outer frame includes a first frame body and an  │
│ encapsulating structure. The first frame body           │
│ surrounds to define a second space. The main body is    │
│ at least partially located in the second space and      │
│ abuts against the first frame body of the plastic outer │
│ frame. The encapsulating structure is connected with    │
│ an inner side of the first frame body. A portion of the │
│ liquid infusion tube exposed outside the main body is   │
│ embedded inside the encapsulating structure of the      │
│ plastic outer frame.                                    │
└─────────────────────────────────────────────────────────┘ — 506
                              ↓
┌─────────────────────────────────────────────────────────┐
│ Using an electroplating equipment to contact at least   │
│ one of the electroplating regions on an outer surface   │
│ of the main body to carry out electroplating treatment  │
│ to the outer surface.                                   │
└─────────────────────────────────────────────────────────┘ — 507
```

Fig. 7

METHOD FOR MANUFACTURING VAPOR CHAMBER

RELATED APPLICATIONS

This application is a Divisional Application of the U.S. application Ser. No. 18/513,656, filed Nov. 20, 2023, now U.S. Pat. No. 12,213,284 issued on Jan. 28, 2025, which is a divisional application of U.S. application Ser. No. 17/585,597, filed on Jan. 27, 2022, now U.S. Pat. No. 11,985,796 issued on May 14, 2024, which claims priority to Taiwanese Application Serial Number 110110908, filed Mar. 25, 2021, all of which are herein incorporated by reference in their entireties.

BACKGROUND

Technical Field

The present disclosure relates to methods to manufacture vapor chambers.

Description of Related Art

With the rapid advancement of electronic technology, the functions of various electronic products have been greatly enhanced as well. Inevitably, in order to cope with the enhancement of the functions of the electronic products, the requirement of heat dissipation to the processors inside the electronic products has also been increased. Therefore, the application of vapor chambers has become more popular.

In practical applications, a vapor chamber works to deliver away the heat produced during the operation of a processor. However, since a vapor chamber is required to deliver a large amount of heat, how to improve the structural strength of the vapor chamber in order to reduce the chance of thermal deformation and thus damage, is undoubtedly an important issue of the industry.

SUMMARY

A technical aspect of the present disclosure is to provide a method for manufacturing a vapor chamber, which can effectively reduce the manufacturing time and the cost of production of the vapor chamber, reduce the chance that the vapor chamber to be thermally deformed and thus damaged, maintain the flatness of the vapor chamber, and improve the working performance and the working life of the vapor chamber.

According to an embodiment of the present disclosure, a method for manufacturing a vapor chamber includes forming a base plate by forging. The base plate includes a plate body, a peripheral frame and a plurality of supporting pillars. The peripheral frame and the supporting pillars protrude at a surface of the plate body. The supporting pillars are separated from each other. The peripheral frame surrounds the supporting pillars. The surface and the peripheral frame together define a first space. The first space is configured to accommodate a working fluid. The method further includes abutting a top plate against the peripheral frame and the supporting pillars to seal up the first space to form a main body; disposing a liquid infusion tube between the base plate and the top plate, and vacuuming the first space through the liquid infusion tube, the liquid infusion tube has a first opening and a second opening opposite to the first opening, the first opening is located in the first space, the second opening is exposed outside the main body; introducing the working fluid into the first space through the liquid infusion tube; sealing up the liquid infusion tube; and fixing the main body in a mold and forming a plastic outer frame by injection molding in the mold, the plastic outer frame includes two frame bodies and an encapsulating structure, the frame bodies are separated from and opposite with each other, the encapsulating structure is connected with one of the frame bodies, a portion of the liquid infusion tube exposed outside the main body is embedded inside the encapsulating structure.

In one or more embodiments of the present disclosure, the method further includes disposing a first structural plate on the surface in the first space. The first structural plate includes a plurality of first capillary structures. The first capillary structures are located on a side of the first structural plate away from the surface. The method further includes disposing a second structural plate on a side of the top plate facing to the first space. The second structural plate includes a plurality of second capillary structures. The second capillary structures are located on a side of the second structural plate facing to the surface.

In one or more embodiments of the present disclosure, the first capillary structures and the second capillary structures face to each other.

In one or more embodiments of the present disclosure, the main body has two first side surfaces opposite with each other and two second side surfaces opposite with each other. The first side surfaces and the second side surfaces are alternately disposed to surround the main body. The frame bodies respectively abut against a corresponding one of the first side surfaces and a portion of each of the second side surfaces. The second side surfaces are at least partially exposed outside the frame bodies.

In one or more embodiments of the present disclosure, the method further includes using an electroplating equipment to contact at least one of the second surfaces exposed outside the frame bodies to carry out electroplating treatment to the outer surface of the main body.

In one or more embodiments of the present disclosure, the method further includes surrounding and connecting with the main body by a metal frame. The frame bodies are at least partially overlaid on the metal frame.

In one or more embodiments of the present disclosure, connecting with the main body by the metal frame includes spot welding the metal frame to the main body.

In one or more embodiments of the present disclosure, connecting with the main body by the metal frame includes riveting the metal frame to the main body.

In one or more embodiments of the present disclosure, connecting with the main body by the metal frame includes thunder welding the metal frame to the main body.

According to another embodiment of the present disclosure, a method for manufacturing a vapor chamber includes forming a base plate by forging. The base plate includes a plate body, a peripheral frame and a plurality of supporting pillars. The peripheral frame and the supporting pillars protrude at a surface of the plate body. The supporting pillars are separated from each other. The peripheral frame surrounds the supporting pillars. The surface and the peripheral frame together defining a first space. The first space is configured to accommodate a working fluid. The method further includes abutting a top plate against the peripheral frame and the supporting pillars to seal up the first space to form a main body; disposing a liquid infusion tube between the base plate and the top plate, and vacuuming the first space through the liquid infusion tube, the liquid infusion tube has a first opening and a second opening opposite to the first opening, the first opening is located in the first space, the second opening is exposed outside the main body; introducing the working fluid into the first space through the liquid infusion tube; sealing up the liquid infusion tube; carrying out electroplating treatment to an outer surface of the main body; and fixing the main body in a mold and forming a plastic outer frame by injection molding in the mold, the plastic outer frame includes two frame bodies and an encapsulating structure, the frame bodies are separated from and opposite with each other, the frame bodies are respectively connected with the main body, the encapsulating structure is connected with one of the frame bodies, a portion of the liquid infusion tube exposed outside the main body is embedded inside the encapsulating structure.

In one or more embodiments of the present disclosure, the method further includes disposing a first structural plate on the surface in the first space. The first structural plate includes a plurality of first capillary structures. The first capillary structures are located on a side of the first structural plate away from the surface. The method further includes disposing a second structural plate on a side of the top plate facing to the first space. The second structural plate includes a plurality of second capillary structures. The second capillary structures are located on a side of the second structural plate facing to the surface.

In one or more embodiments of the present disclosure, the first capillary structures and the second capillary structures face to each other.

In one or more embodiments of the present disclosure, the main body has two first side surfaces opposite with each other and two second side surfaces opposite with each other. The first side surfaces and the second side surfaces are alternately disposed to surround the main body. The frame bodies respectively abut against a corresponding one of the first side surfaces and a portion of each of the second side surfaces. The second side surfaces are at least partially exposed outside the frame bodies.

In one or more embodiments of the present disclosure, the method further includes surrounding and connecting with the main body by a surrounding frame. The frame bodies are at least partially overlaid on the surrounding frame.

In one or more embodiments of the present disclosure, each of the supporting pillars has a cylindrical shape.

The above-mentioned embodiments of the present disclosure have at least the following advantages:

(1) Since the supporting pillars, the plate body and the peripheral frame are of an integrally-formed structure, the base plate has a sound structural strength. In this way, during the operation of the vapor chamber, the chance that the vapor chamber to be thermally deformed and thus damaged is effectively reduced, while the flatness of the vapor chamber can also be effectively maintained. As a result, the working performance and the working life of the vapor chamber can be effectively improved.

(2) Since the base plate including the plate body, the peripheral frame and the supporting pillars is formed from a single sheet by forging, the base plate is an integrally-formed structure. Thus, the manufacturing time and the cost of production of the base plate can be effectively reduced.

(3) Since a portion of the liquid infusion tube exposed outside the main body is embedded inside the encapsulating structure of the plastic outer frame, the portion of the liquid infusion tube exposed outside the main body is protected by the encapsulating structure, and the chance that the liquid infusion tube is damaged due to collision is thus avoided. Moreover, the risk of leakage of the working fluid from the main body is also reduced.

BRIEF DESCRIPTION OF THE DRAWINGS

The disclosure can be more fully understood by reading the following detailed description of the embodiments, with reference made to the accompanying drawings as follows:

FIG. 7 is a flow diagram of a manufacturing method of a vapor chamber according to an embodiment of the present disclosure.

DETAILED DESCRIPTION

Figure 1:
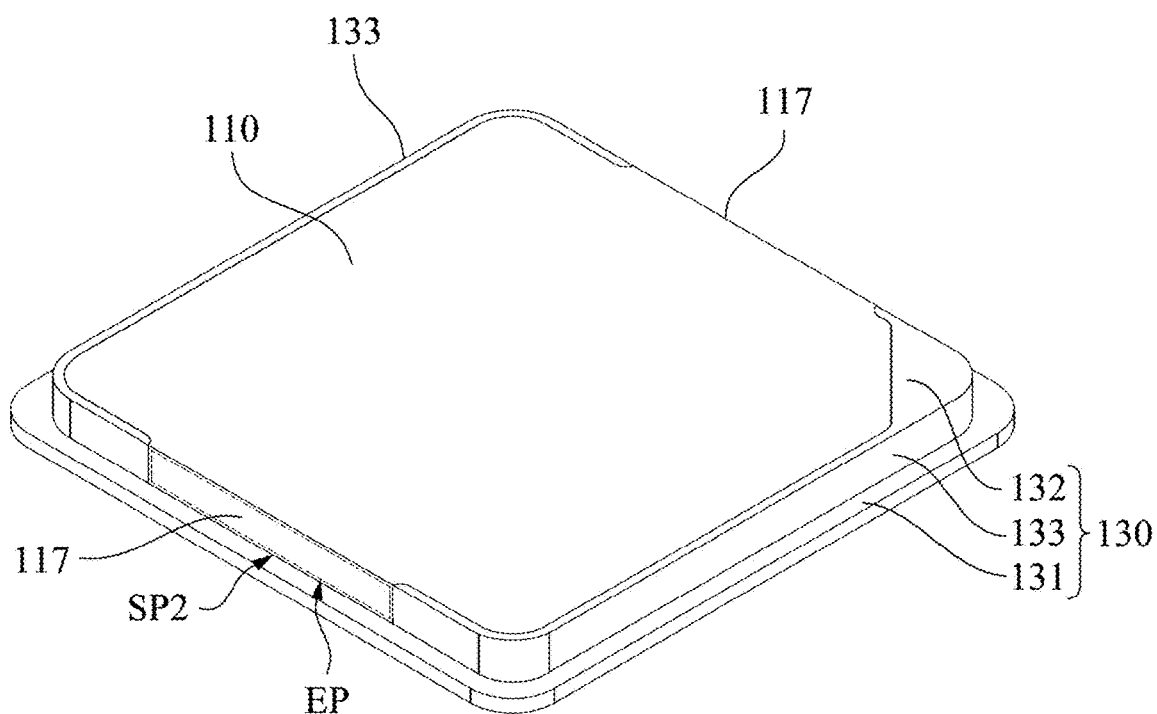
FIG. 1 is a schematic view of a vapor chamber according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
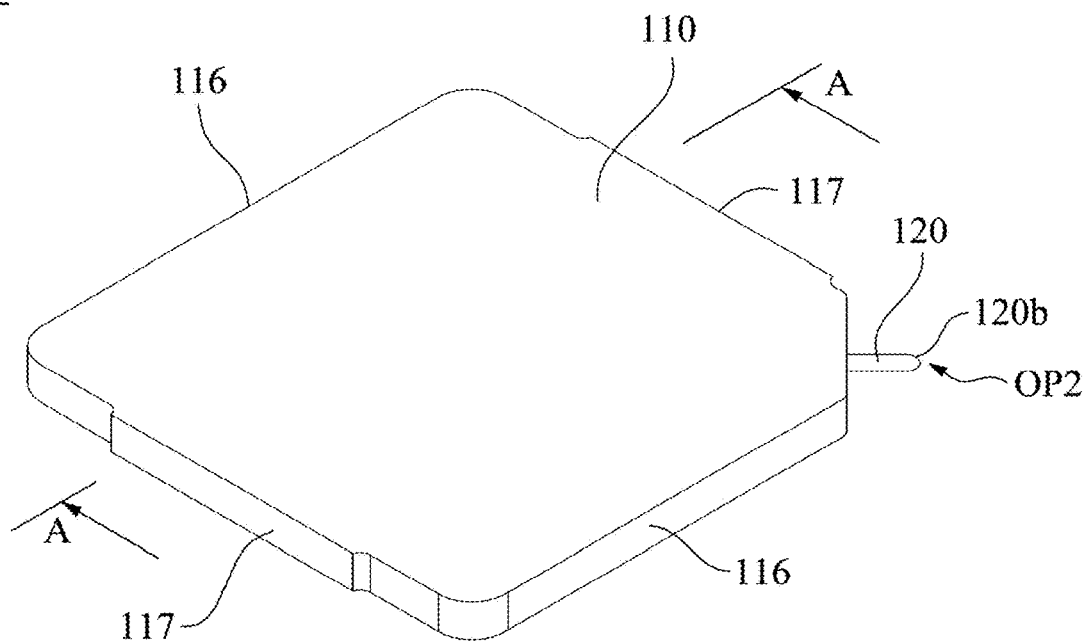
FIG. 2 is an exploded view of the vapor chamber of FIG. 1.
Figure 2:
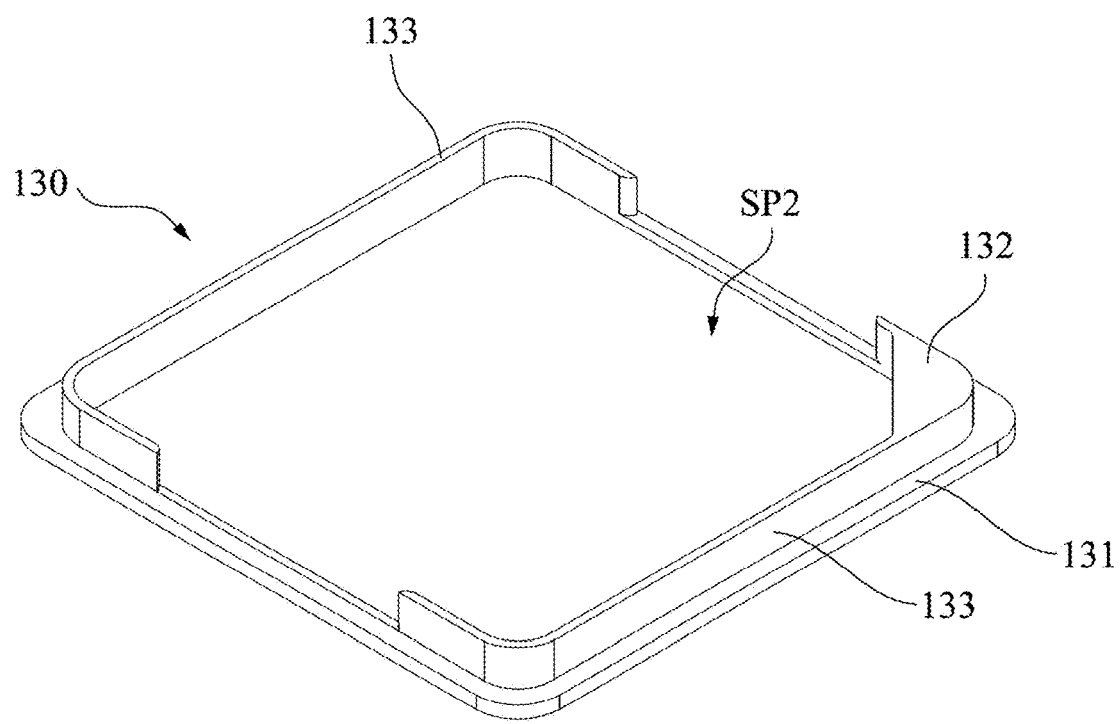

Reference is made to FIGS. 1-2. FIG. 1 is a schematic view of a vapor chamber 100 according to an embodiment of the present disclosure. FIG. 2 is an exploded view of the vapor chamber 100 of FIG. 1. In this embodiment, as shown in FIGS. 1-2, a vapor chamber 100 includes a main body 110 and a plastic outer frame 130. The main body 110 is configured to abut against an electronic element (not shown), in order to carry out heat dissipation to the electronic element during operation. The plastic outer frame 130 provides the function of fixing and protection to the main body 110.

To be specific, the plastic outer frame 130 includes a first frame body 131 and an encapsulating structure 132. The first frame body 131 surrounds to define a second space SP2. As shown in FIG. 1, the main body 110 is at least partially located in the second space SP2 and abuts against the first frame body 131 of the plastic outer frame 130. The vapor chamber 100 further includes a liquid infusion tube 120 (as shown in FIG. 2). The liquid infusion tube 120 inserts into the main body 110 and is at least partially exposed outside the main body 110. The encapsulating structure 132 of the plastic outer frame 130 is connected with an inner side of the first frame body 131. A portion of the liquid infusion tube 120 exposed outside the main body 110 is embedded inside the encapsulating structure 132 of the plastic outer frame 130 (the liquid infusion tube 120 is thus not shown in FIG. 1). Therefore, the portion of the liquid infusion tube 120 exposed outside the main body 110 is protected by the encapsulating structure 132, and the chance that the liquid infusion tube 120 is damaged due to collision is thus avoided. For an example, as shown in FIGS. 1-2, the first frame body 131 has a rectangular shape, and the encapsulating structure 132 is connected with an inner corner of the first frame body 131. However, this does not intend to limit the present disclosure.

Moreover, as shown in FIGS. 1-2, the plastic outer frame 130 further includes two second frame bodies 133. The second frame bodies 133 are separated from and opposite with each other. The second frame bodies 133 define the second space SP2 therebetween. The second frame bodies 133 are respectively connected with the first frame body 131. The encapsulating structure 132 is connected with one of the second frame bodies 133. In this embodiment, each of the second frame bodies 133 and the first frame body 131 form a stair structure.

In addition, as shown in FIG. 2, the main body 110 has two first side surfaces 116 opposite with each other and two second side surfaces 117 opposite with each other. The first side surfaces 116 and the second side surfaces 117 are alternately disposed to surround the main body 110 and are configured to abut against the first frame body 131. The second frame bodies 133 are respectively configured to abut against a corresponding one of the first side surfaces 116 and a portion of each of the second side surfaces 117. Therefore, as shown in FIG. 1, each of the second side surfaces 117 is at least partially exposed outside the second frame bodies 133 to define an electroplating region EP. In other words, each of the electroplating regions EP is located on a corresponding one of the second side surfaces 117 and between the second frame bodies 133. In practical applications, a user can use an electroplating equipment (not shown) to contact at least one of the electroplating regions EP to carry out electroplating treatment to an outer surface of the main body 110.

In other embodiments, a user can also carry out electroplating treatment to the outer surface of the main body 110 before the main body 110 is disposed inside the plastic outer frame 130. Under this situation, the user can contact an appropriate location on the outer surface of the main body 110 with the electroplating equipment according to the actual conditions, which is not restricted to the position of the electroplating regions EP. After electroplating treatment to the outer surface of the main body 110 is completed, the main body 110 is then disposed inside the plastic outer frame 130.

Figure 3:
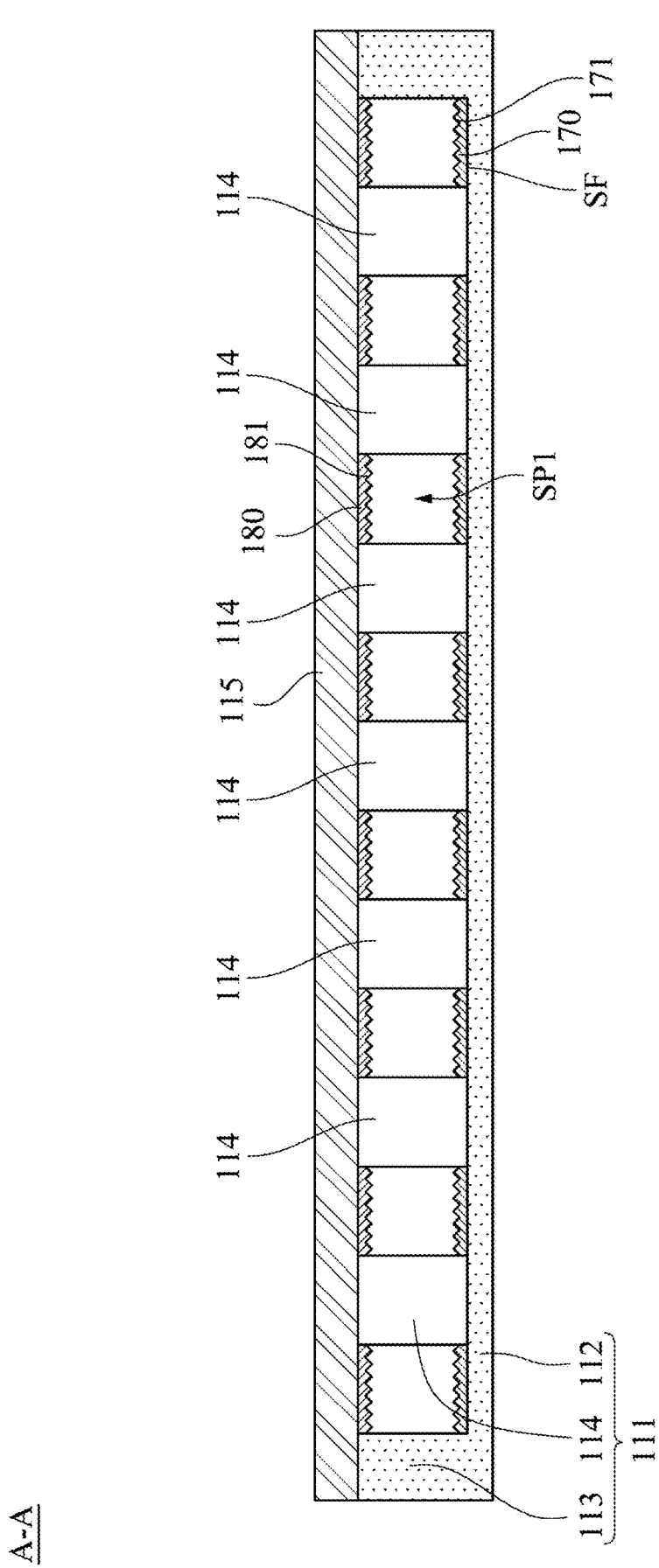
FIG. 3 is a cross-sectional view along the section line A-A of FIG. 2.
Figure 4:
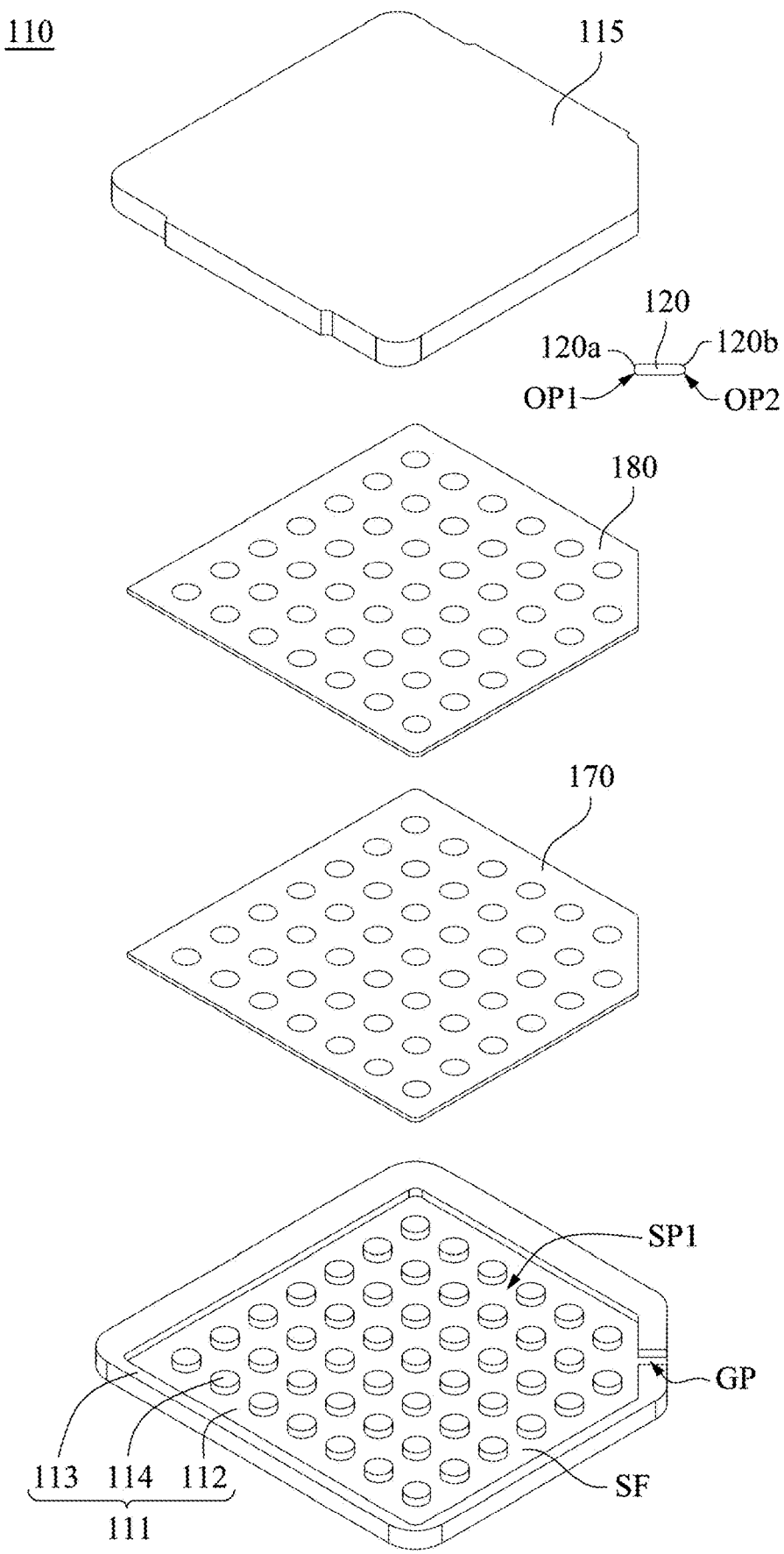
FIG. 4 is an exploded view of the main body of FIG. 2.

Reference is made to FIGS. 3-4. FIG. 3 is a cross-sectional view along the section line A-A of FIG. 2. FIG. 4 is an exploded view of the main body 110 of FIG. 2. In this embodiment, as shown in FIGS. 3-4, the main body 110 includes a base plate 111 and a top plate 115. The base plate 111 includes a plate body 112, a peripheral frame 113 and a plurality of supporting pillars 114. The plate body 112 has a surface SF. The peripheral frame 113 is disposed on the surface SF of the plate body 112. The surface SF of the plate body 112 and the peripheral frame 113 together define a first space SP1. The first space SP1 is configured to accommodate a working fluid (not shown). The supporting pillars 114 are located in the first space SP1 and distributed on the surface SF of the plate body 112. It is worth to note that, in this embodiment, the supporting pillars 114, the plate body 112 and the peripheral frame 113 are of an integrally-formed structure. Therefore, the base plate 111 has a sound structural strength. The top plate 115 abuts against the peripheral frame 113 and the supporting pillars 114 to seal up the first space SP1.

Furthermore, as shown in FIG. 4, the peripheral frame 113 of the base plate 111 has a gap GP. The gap GP is communicated with the first space SP1. The liquid infusion tube 120 is configured to penetrate through the gap GP. To be specific, the liquid infusion tube 120 has a first end 120a and a second end 120b. The second end 120b is opposite to the first end 120a. The first end 120a is located in the first space SP1. The second end 120b is exposed outside the main body 110. In this embodiment, as shown in FIG. 4, each of the supporting pillars 114 has a cylindrical shape. However, this does not intend to limit the present disclosure.

In addition, as shown in FIGS. 3-4, the vapor chamber 100 further includes a first structural plate 170 and a second structural plate 180. The first structural plate 170 is located in the first space SP1 and is disposed on the surface SF of the plate body 112. The first structural plate 170 includes a plurality of first capillary structures 171. The first capillary structures 171 are located on a side of the first structural plate 170 away from the surface SF. The second structural plate 180 is located in the first space SP1 and is disposed on the top plate 115. The second structural plate 180 includes a plurality of second capillary structures 181. The second capillary structures 181 are located on a side of the second structural plate 180 facing to the surface SF. In practical applications, according to the actual situations, the first capillary structures 171 and the second capillary structures 181 can be tiny protruding structures, recessed structures or net structures. However, this does not intend to limit the present disclosure.

During the operation of the vapor chamber 100, the working fluid accommodated in the first space SP1 changes its phase through repeated evaporations and condensations in order to provide the function of heat transfer. The first capillary structures 171 of the first structural plate 170 and the second capillary structures 181 of the second structural plate 180 are configured to enhance the efficiency of evaporations and condensations of the working fluid in the first space SP1. It is worth to note that, as mentioned above, since the supporting pillars 114, the plate body 112 and the peripheral frame 113 are of an integrally-formed structure, the base plate 111 has a sound structural strength. In this way, during the operation of the vapor chamber 100, the chance that the vapor chamber 100 to be thermally deformed and thus damaged is effectively reduced, while the flatness of the vapor chamber 100 can also be effectively maintained. As a result, the working performance and the working life of the vapor chamber 100 can be effectively improved.

Figure 5:
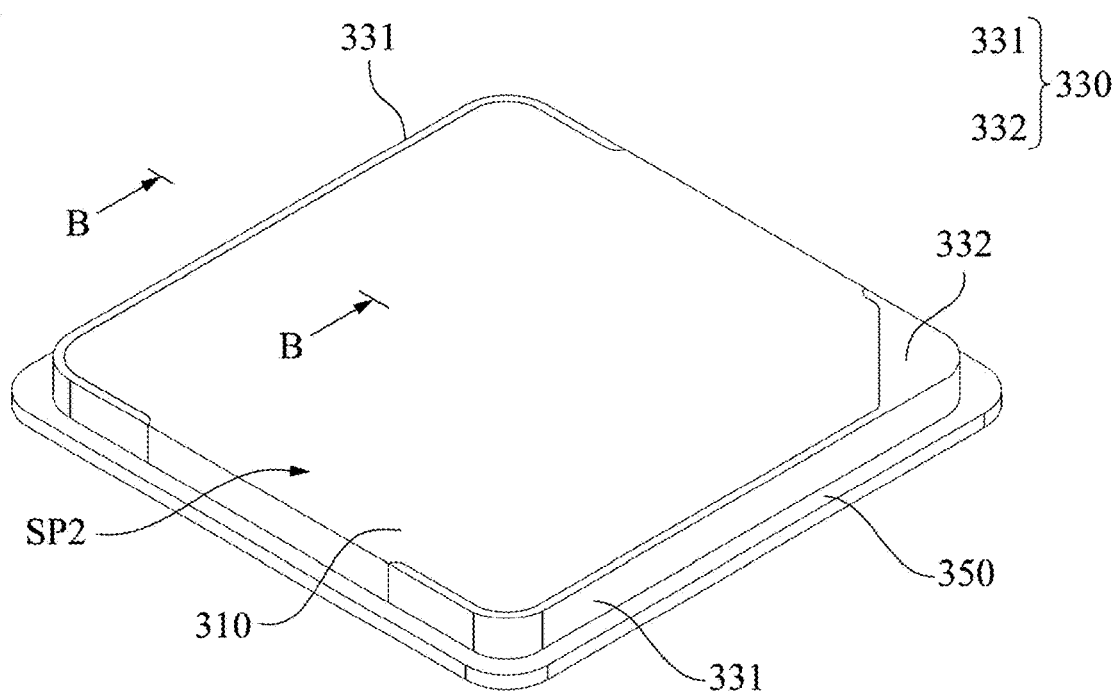
FIG. 5 is a schematic view of a vapor chamber according to another embodiment of the present disclosure.
Figure 6:
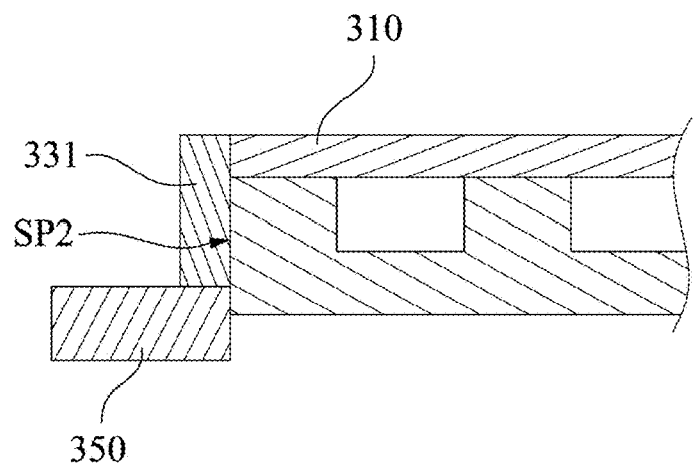
FIG. 6 is a partially cross-sectional view along the section line B-B of FIG. 5.

Reference is made to FIGS. 5-6. FIG. 5 is a schematic view of a vapor chamber 300 according to another embodiment of the present disclosure. FIG. 6 is a partially cross-sectional view along the section line B-B of FIG. 5. In this embodiment, as shown in FIGS. 5-6, the vapor chamber 300 includes a main body 310, a plastic outer frame 330 and a metal frame 350. The plastic outer frame 330 includes two third frame bodies 331 and an encapsulating structure 332. The third frame bodies 331 are separated from and opposite with each other. The third frame bodies 331 define the second space SP2 therebetween. The encapsulating structure 332 is connected with one of the third frame bodies 331 and is configured to encapsulate the liquid infusion tube (not shown in FIGS. 5-6, please refer to FIGS. 2 and 4) of the vapor chamber 300. The third frame bodies 331 and the metal frame 350 respectively surround and connect with the main body 310. The third frame bodies 331 are respectively and at least partially overlaid on the metal frame 350. For example, the metal frame 350 can be connected with the main body 310 by procedures such as spot welding, riveting or thunder welding, so as to increase the overall structural strength of the vapor chamber 300. The metal frame 350 can be of a material such as copper, titanium, iron or stainless steel for a better strength. However, this does not intend to limit the present disclosure.

With regards to the vapor chamber 100 as mentioned above, the present disclosure provides a manufacturing method 500 of the vapor chamber 100. For example, reference is made to FIG. 7. FIG. 7 is a flow diagram of a manufacturing method 500 of a vapor chamber 100 according to an embodiment of the present disclosure. In this embodiment, as shown in FIG. 7, a manufacturing method 500 includes the following operations (it is appreciated that the sequence of the operations and the sub-operations as mentioned below, unless otherwise specified, can all be adjusted upon the actual needs, or even executed at the same time or partially at the same time):

(1) Forming the base plate 111, which is integrally-formed, by forging. As mentioned above, the base plate 111 includes the plate body 112, the peripheral frame 113 and the plurality of supporting pillars 114. The peripheral frame 113 and the supporting pillars 114 protrude at the surface SF of the plate body 112. The supporting pillars 114 are separated from each other and distributed on the surface SF of the plate body 112. The peripheral frame 113 surrounds the supporting pillars 114 (please also refer to FIG. 4 at the same time). The surface SF and the peripheral frame 113 together define the first space SP1. The first space SP1 is configured to accommodate the working fluid (Operation 501). It is worth to note that, since the base plate 111 including the plate body 112, the peripheral frame 113 and the supporting pillars 114 is formed from a single sheet (not shown) by forging, the base plate 111 is an integrally-formed structure. Therefore, working procedures such as disposing the supporting pillars 114 on the plate body 112 can be eliminated. Thus, the manufacturing time and the cost of production of the base plate 111 can be effectively reduced.

(2) Abutting the top plate 115 against the peripheral frame 113 and the supporting pillars 114 to seal up the first space SP1 to form the main body 110 (Operation 502).

In addition, before abutting the top plate 115 against the peripheral frame 113 and the supporting pillars 114, the manufacturing method 500 further includes the following two operations:

(3) Disposing the first structural plate 170 (please see FIGS. 3-4) on the surface SF in the first space SP1. The first structural plate 170 includes the first capillary structures 171. The first capillary structures 171 are located on a side of the first structural plate 170 away from the surface SF.

(4) Disposing the second structural plate 180 (please see FIGS. 3-4) on a side of the top plate 115 facing to the first space SP1. The second structural plate 180 includes the second capillary structures 181. The second capillary structures 181 are located on a side of the second structural plate 180 facing to the surface SF.

Furthermore, the manufacturing method 500 further includes:

(5) Vacuuming the first space SP1 through the liquid infusion tube 120 (Operation 503). To be specific, before or after abutting the top plate 115 against the peripheral frame 113 and the supporting pillars 114, a user disposes the liquid infusion tube 120 at the gap GP of the peripheral frame 113. As shown in FIGS. 2 and 4, the liquid infusion tube 120 has a first opening OP1 and a second opening OP2. The second opening OP2 is opposite to the first opening OP1. The first opening OP1 is located in the first space SP1. The second opening OP2 is exposed outside the main body 110. The first opening OP1 and the second opening OP2 are communicated with each other. Through the liquid infusion tube 120, the user vacuums the first space SP1.

(6) Introducing the working fluid into the first space SP1 through the liquid infusion tube 120 (Operation 504).

(7) Sealing up the liquid infusion tube 120 after an appropriate amount of the working fluid is introduced into the first space SP1, such that the first opening OP1 and the second opening OP2 are no longer communicated with each other (Operation 505). At this point, the manufacture of the main body 110 of the vapor chamber 100 is completed. To be specific, the liquid infusion tube 120 has the first end 120a and the second end 120b opposite to the first end 120a. The first opening OP1 is located at the first end 120a while the first end 120a is located in the first space SP1. The second opening OP2 is located at the second end 120b while the second end 120b is exposed outside the main body 110.

After the manufacture of the main body 110 of the vapor chamber 100 is completed, the manufacturing method 500 further includes:

(8) Fixing the main body 110 in a mold (not shown) and forming the plastic outer frame 130 by injection molding in the mold (Operation 506). It is noted that, the plastic material to be injected should be resistant to high temperature, have a high bonding force and be arranged with a similar coefficient of thermal expansion, such as epoxy resin or others. For example, a material with sound strength, similar nature of thermal expansion as the main body 110 and capability to bear the high temperature of package reflow, such as epoxy molding compound (EMC), silicone resin, liquid crystal polymer (LCP), polyphthalamide (PPA), is commonly chosen for the plastic outer frame 130.

To be specific, in this embodiment, the plastic outer frame 130 includes the first frame body 131 and the encapsulating structure 132. The first frame body 131 surrounds to define the second space SP2. The main body 110 is at least partially located in the second space SP2 and abuts against the first frame body 131 of the plastic outer frame 130. The encapsulating structure 132 is connected with an inner side of the first frame body 131. A portion of the liquid infusion tube 120 exposed outside the main body 110 is embedded inside the encapsulating structure 132 of the plastic outer frame 130. In this way, the portion of the liquid infusion tube 120 exposed outside the main body 110 is protected by the encapsulating structure 132, and the chance that the liquid infusion tube 120 is damaged due to collision is thus avoided. Moreover, the risk of leakage of the working fluid from the main body 110 is also reduced.

As mentioned above, the plastic outer frame 130 further includes two second frame bodies 133. The second frame bodies 133 are separated from and opposite with each other. The second frame bodies 133 define the second space SP2 therebetween. The second frame bodies 133 are respectively connected with the first frame body 131. The encapsulating structure 132 is connected with one of the second frame bodies 133. In this embodiment, each of the second frame bodies 133 and the first frame body 131 form a stair structure. However, this does not intend to limit the present disclosure. According to the actual situations, different designs of the appearance characteristics of the second frame bodies 133 and the first frame body 131 can be adopted.

In addition, the main body 110 has two first side surfaces 116 opposite with each other and two second side surfaces 117 opposite with each other. The first side surfaces 116 and the second side surfaces 117 are alternately disposed to surround the main body 110 and abut against the first frame body 131. The second frame bodies 133 respectively abut against a corresponding one of the first side surfaces 116 and a portion of each of the second side surfaces 117. Each of the second side surfaces 117 is at least partially exposed outside the second frame bodies 133 to define an electroplating region EP.

In other embodiments, the manufacturing method 500 further includes:
(9) Using an electroplating equipment (not shown) to contact at least one of the electroplating regions EP (please refer to FIG. 1) to carry out electroplating treatment to the outer surface of the main body 110 (Operation 507).

In other embodiments, a user can also carry out electroplating treatment to the outer surface of the main body 110 before the main body 110 is disposed inside the plastic outer frame 130. Under this situation, the user can contact an appropriate location on the outer surface of the main body 110 with the electroplating equipment according to the actual conditions, which is not restricted to the position of the electroplating regions EP. After electroplating treatment to the outer surface of the main body 110 is completed, Operation 506 above is then repeated.

In conclusion, the aforementioned embodiments of the present disclosure have at least the following advantages:
(1) Since the supporting pillars, the plate body and the peripheral frame are of an integrally-formed structure, the base plate has a sound structural strength. In this way, during the operation of the vapor chamber, the chance that the vapor chamber to be thermally deformed and thus damaged is effectively reduced, while the flatness of the vapor chamber can also be effectively maintained. As a result, the working performance and the working life of the vapor chamber can be effectively improved.
(2) Since the base plate including the plate body, the peripheral frame and the supporting pillars is formed from a single sheet by forging, the base plate is an integrally-formed structure. Thus, the manufacturing time and the cost of production of the base plate can be effectively reduced.
(3) Since a portion of the liquid infusion tube exposed outside the main body is embedded inside the encapsulating structure of the plastic outer frame, the portion of the liquid infusion tube exposed outside the main body is protected by the encapsulating structure, and the chance that the liquid infusion tube is damaged due to collision is thus avoided. Moreover, the risk of leakage of the working fluid from the main body is also reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A method for manufacturing a vapor chamber, comprising:
   forming a base plate by forging, the base plate comprising a plate body, a peripheral frame and a plurality of supporting pillars, the peripheral frame and the supporting pillars protruding at a surface of the plate body, the supporting pillars being separated from each other, the peripheral frame surrounding the supporting pillars, the surface and the peripheral frame together defining a space, the space being configured to accommodate a working fluid;
   abutting a top plate against the peripheral frame and the supporting pillars to seal up the space to form a main body, the main body having two first side surfaces opposite with each other and two second side surfaces opposite with each other, the first side surfaces and the second side surfaces being alternately disposed to surround the main body;
   disposing a liquid infusion tube between the base plate and the top plate, and vacuuming the space through the liquid infusion tube, the liquid infusion tube having a first opening and a second opening opposite to the first opening, the first opening being located in the space, the second opening being exposed outside the main body;
   introducing the working fluid into the space through the liquid infusion tube;
   sealing up the liquid infusion tube; and
   fixing the main body in a mold and forming a plastic outer frame by injection molding in the mold, the plastic outer frame comprising two frame bodies and an encapsulating structure, the frame bodies being separated from and opposite with each other, the frame bodies respectively abutting against a corresponding one of the first side surfaces and a portion of each of the second side surfaces, the second side surfaces being at least partially exposed outside the frame bodies, the encapsulating structure being connected with one of the frame bodies, a portion of the liquid infusion tube exposed outside the main body being embedded inside the encapsulating structure.

2. The method of claim 1, further comprising:
   disposing a first structural plate on the surface in the space, the first structural plate comprising a plurality of first capillary structures, the first capillary structures being located on a side of the first structural plate away from the surface; and
   disposing a second structural plate on a side of the top plate facing to the space, the second structural plate comprising a plurality of second capillary structures, the second capillary structures being located on a side of the second structural plate facing to the surface.

3. The method of claim 2, wherein the first capillary structures and the second capillary structures face to each other.

4. The method of claim 1, further comprising:
using an electroplating equipment to contact at least one of the second surfaces exposed outside the frame bodies to carry out electroplating treatment to the outer surface of the main body.

5. The method of claim 1, further comprising:
surrounding and connecting with the main body by a metal frame, the frame bodies being at least partially overlaid on the metal frame.

6. The method of claim 5, wherein connecting with the main body by the metal frame comprises:
spot welding the metal frame to the main body.

7. The method of claim 5, wherein connecting with the main body by the metal frame comprises:
riveting the metal frame to the main body.

8. A method for manufacturing a vapor chamber, comprising:
forming a base plate by forging, the base plate comprising a plate body, a peripheral frame and a plurality of supporting pillars, the peripheral frame and the supporting pillars protruding at a surface of the plate body, the supporting pillars being separated from each other, the peripheral frame surrounding the supporting pillars, the surface and the peripheral frame together defining a space, the space being configured to accommodate a working fluid;
abutting a top plate against the peripheral frame and the supporting pillars to seal up the space to form a main body, the main body having two first side surfaces opposite with each other and two second side surfaces opposite with each other, the first side surfaces and the second side surfaces being alternately disposed to surround the main body;
disposing a liquid infusion tube between the base plate and the top plate, and vacuuming the space through the liquid infusion tube, the liquid infusion tube having a first opening and a second opening opposite to the first opening, the first opening being located in the space, the second opening being exposed outside the main body;
introducing the working fluid into the space through the liquid infusion tube;
sealing up the liquid infusion tube;
carrying out electroplating treatment to an outer surface of the main body; and
fixing the main body in a mold and forming a plastic outer frame by injection molding in the mold, the plastic outer frame comprising two frame bodies and an encapsulating structure, the frame bodies being separated from and opposite with each other, the frame bodies being respectively abutting against a corresponding one of the first side surfaces and a portion of each of the second side surfaces, the second side surfaces being at least partially exposed outside the frame bodies, the encapsulating structure being connected with one of the frame bodies, a portion of the liquid infusion tube exposed outside the main body being embedded inside the encapsulating structure.

9. The method of claim 8, further comprising:
disposing a first structural plate on the surface in the space, the first structural plate comprising a plurality of first capillary structures, the first capillary structures being located on a side of the first structural plate away from the surface; and
disposing a second structural plate on a side of the top plate facing to the space, the second structural plate comprising a plurality of second capillary structures, the second capillary structures being located on a side of the second structural plate facing to the surface.

10. The method of claim 9, wherein the first capillary structures and the second capillary structures face to each other.

11. The method of claim 8, further comprising:
surrounding and connecting with the main body by a surrounding frame, the frame bodies being at least partially overlaid on the surrounding frame.

12. The method of claim 8, wherein each of the supporting pillars has a cylindrical shape.

* * * * *